Jan. 27, 1959 H. T. LYMAN 2,871,360

WIDE RANGE TUNER WITH FLAT COIL AND CAVITY RESONATOR

Filed Nov. 15, 1955 2 Sheets-Sheet 1

INVENTOR.
Harold T. Lyman
BY Oomo, McDougall, Williams & Hersh
Attorneys

INVENTOR.
Harold T. Lyman
BY Dawson, McDougall, Williams & Hersh
Attorneys

United States Patent Office 2,871,360

Patented Jan. 27, 1959

2,871,360

WIDE RANGE TUNER WITH FLAT COIL AND CAVITY RESONATOR

Harold T. Lyman, Milford, Conn., assignor to Aladdin Industries, Incorporated, Nashville, Tenn., a corporation of Illinois Application November 15, 1955, Serial No. 546,943

7 Claims. (Cl. 250—40)

This invention relates to radio frequency tuners adapted to cover a wide frequency range, such as one encompassing all of the bands now assigned for commercial television broadcasting, for example. Thus, one principal object of the present invention is to provide a new and improved tuner adapted to afford continuous coverage of an extremely wide range of frequencies, which may include, for example, the very high frequency (V. H. F.) television bands extending from 54 to 216 megacycles, as well as the ultra high frequency (U. H. F.) television band extending from 470 to 890 megacycles.

A further object is to provide a new and improved tuner of the foregoing character which will afford extremely advantageous characteristics with regard to selectivity and efficiency throughout the tuning range of the tuner and particularly in the high frequency portion of the tuning range.

Thus, it is an object of the present invention to provide a new and improved tuner having an extremely high factor of merit or Q in the U. H. F. television band.

It is another object to provide a new and improved tuner of the foregoing character which will cover its extremely wide frequency range with less than a single revolution of a rotatable control shaft.

A further object is to provide a new and improved tuner of the foregoing character in which the major tuning components may be produced by printed circuit techniques at very low cost.

It is a further object to provide a new and improved tuner which may be manufactured very economically yet is highly efficient in operation.

Another object is to provide a new and improved tuner which is unusually compact and rugged in construction.

Further objects and advantages of the present invention will appear from the following description taken with the accompanying drawings, in which.

Figure 1:
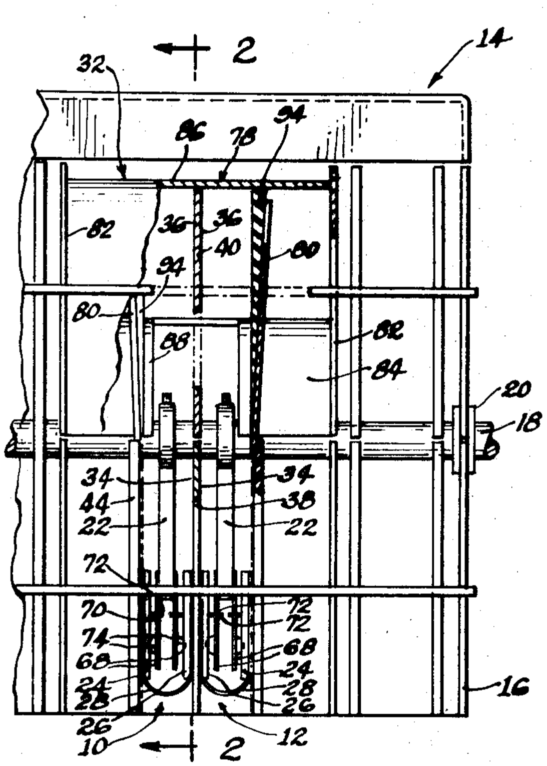
Figure 1 is an elevational view of a wide range radio frequency tuner constituting an illustrative embodiment of the invention, the tuner being shown with certain parts broken away and illustrated in section.

If the drawings are considered in greater detail, it will be seen that they illustrate a pair of tuners 10 and 12 which are combined in a tuning unit 14 mounted on a metal chassis or frame 16. The following description will be directed for the most part to the tuner 10, inasmuch as the tuners 10 and 12 are virtually identical in construction.

Both tuners 10 and 12 are controlled by a shaft 18 rotatably mounted in bearings 20 carried by the chassis 16. Each tuner has a tuning arm 22 fixed on the shaft 18 for swinging movement therewith. In this instance, two slider electrodes or brushes 24 and 26 are mounted on the arm 22. The brushes 24 and 26 are connected together by means of a thin conductive strip 28 which may be made of metal foil.

It will be evident that the electrodes 24 and 26 are movable with the arm 22 along an arcuate path which is nearly semi-circular in this instance. In order that the tuner 10 may cover an extremely wide frequency range, a plurality of different types of tuning elements are distributed along the path of the electrodes. To cover the low frequency portion of the tuning range, a flat inductance coil 30 is mounted along one portion of the arcuate path. A cavity resonator 32 is disposed along the remaining portion of the path to cover the high frequency portion of the tuning range. More specifically, the flat coil 30 may be arranged to provide coverage of the V. H. F. television bands, while the cavity resonator 32 provides coverage of the U. H. F. band.

Figure 7:
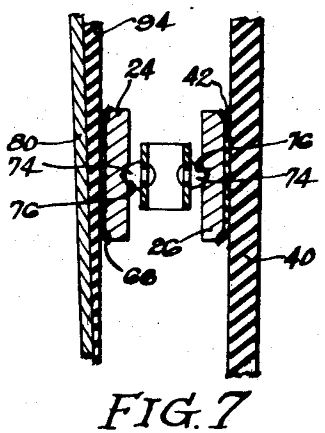
Fig. 7 is a view similar to Fig. 4 but showing a slightly modified construction.
Figure 4:
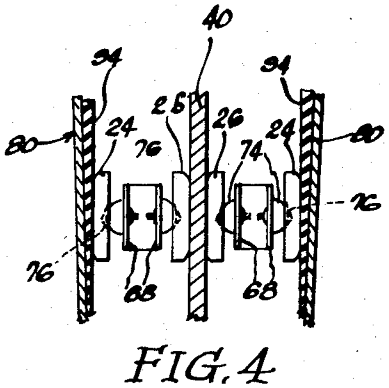
Fig. 4 is a fragmentary enlarged sectional view corresponding to a portion of Fig. 1 but with a movable tuning element in a changed position.

In the illustrated tuner 10, the slider electrode 26 is employed to establish a circuit connection to the slider electrode 24, while the latter cooperates with the flat coil 30 and the cavity resonator 32 to vary the tuning thereof. Thus, the electrode 26 is arranged to slide along coplanar surfaces 34 and 36 of a pair of aligned conductive plates 38 and 40 mounted on the chassis 16 and electrically connected thereto. The plates 38 and 40 thus effectively constitute a single member but are made separately to facilitate assembly and disassembly of the tuning unit 14. The brush 26 may be arranged to engage the plates 38 and 40 conductively as illustrated in Fig. 4. Alternatively, a thin insulating coating 42 may be applied to the electrode 26, as shown in Fig. 7, so that the mode of coupling between the electrode and the plates 38 and 40 will be capacitive. This modified arrangement has the advantage of eliminating any possible electrical noise that might be produced by sliding conductive contact between the electrode 26 and the plates 38 and 40.

While the arrangement of the flat coil 30 may be varied to a considerable extent, the illustrated coil comprises a plurality of flat generally spiral-shaped turns or convolutions mounted on the insulating plate 44. It will be understood by those skilled in the art that the conductive elements of the coil 30 may be formed on the supporting plate 44 by printed circuit techniques. Such techniques are well known and need not be described herein. However, by the use of printed circuit techniques, the flat coil 30 may be formed at extremely low cost.

Figures 2, 6:
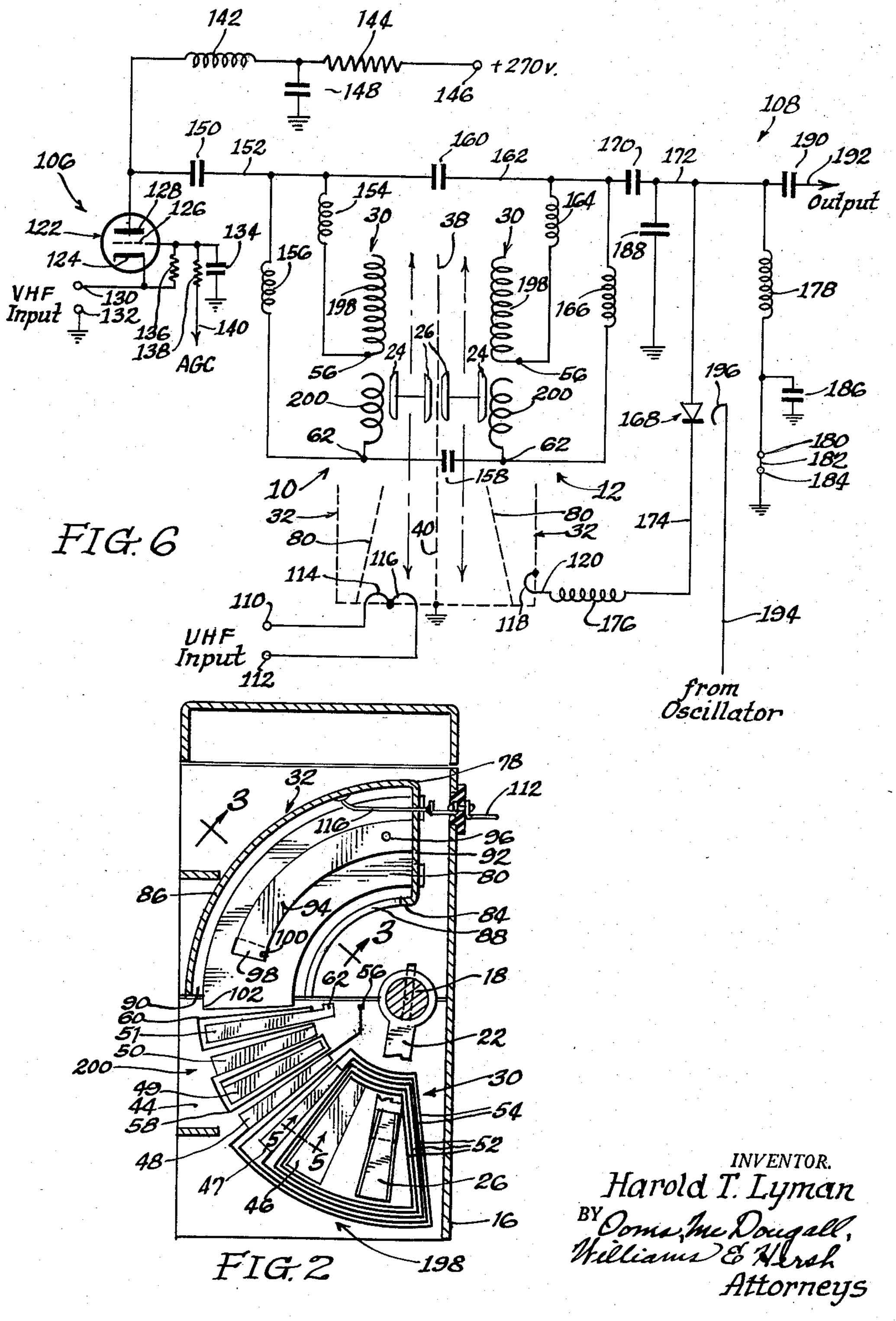
Fig. 2 is a transverse elevational sectional view taken generally along the line 2—2 in Fig. 1.
Fig. 6 is a schematic wiring diagram showing the tuner of Fig. 1 embodied in a portion of a receiver for television or other radio frequency signals.

As shown to best advantage in Fig. 2, the particular flat coil 30, embodied in the tuner 10, comprises a series of flat, thin, stationary electrodes or plates 46, 47, 48, 49, 50 and 51 which are sector-shaped and are mounted in spaced relation along the arcuate path of the electrode 24. A plurality of spiral-shaped coil elements extend along the surface of the plate 44 between the stationary electrodes 46—51. More specifically, a coil 52 of about 3 turns extends around the stationary electrode 46 and is connected between the electrodes 46 and 47. A coil 54 of about two turns extends between the stationary electrodes 47 and 48 and is arranged to extend around the electrodes 46 and 47. It will be seen that the electrode 48 is connected to a tap or terminal 56.

Still another coil element 58 of about one turn encircles the electrode 49 and extends between the electrodes 49 and 50. Another coil element 60 of about one turn partially encircles the electrode 51 and extends between the electrodes 50 and 51. The second terminal 62 is connected to the electrode 51.

Figure 5:
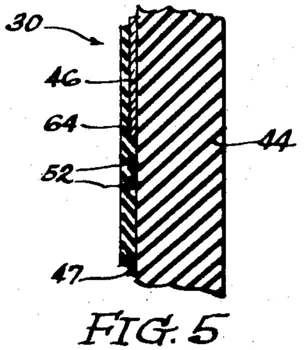
Fig. 5 is a fragmentary greatly enlarged sectional view taken generally along a line 5—5 in Fig. 2.

While the electrode 24 might be arranged to engage the coil 30 conductively, it is preferred that the electrode be insulated from the coil so that the mode of energy interchange between the electrode and the coil will be capacitive. In this instance, this is accomplished by covering all of the conductive elements of the coil 30 with a thin, insulating coating 64 (Fig. 5) which may be made of a hard, wear resisting, synthetic plastic material. Alternatively, the electrode 24 may be provided with a similar coating 66 as illustrated in Fig. 7.

It will be understood that the portion of the coil 30 underlying the electrode 24 is closely coupled thereto by virtue of the capacitance between the coil and the electrode. The underlying portion of the coil is thereby effectively grounded to the chassis 16, inasmuch as the electrode 24 is closely coupled to ground through the electrode 26 and the plate 38. Thus, moving the electrode 24 will vary the effective inductance between the terminal 56 and ground. Further movement will vary the effective inductance between the terminal 62 and ground. Various circuit connections may be made to the terminals 56 and 62, as will be discussed in greater detail subsequently herein.

The electrodes 24 and 26 are biased against the flat coil 30 and the plate 38 by means of individual flat spring arms 68 which are employed to mount the electrodes on the arm 22. It will be seen that the inner ends of the springs 68 are riveted or otherwise secured to the outer end of the arm 22. It is preferred that the arm 22 be made of insulating material. The electrodes 24 and 26 are retained on the springs 68 by means of pins 70 which are fixed on the electrodes and are arranged to extend through apertures 72 in the springs. In addition, hemispherical detent members 74 are riveted or otherwise secured to the springs 68 and are arranged to seat in recesses 76 formed in the electrodes 24 and 26.

In this instance, the cavity resonator 32 comprises a housing 78 of generally tubular, arcuate form. Within the housing 78 is a tuning element 80 which is illustrated as taking the form of a flat center post. Thus, the cavity resonator 32 is of the re-entrant type. In passing into and along the cavity resonator 32, the electrode 24 moves adjacent the element 80 and thereby varies the tuning of the resonator.

Figure 3:
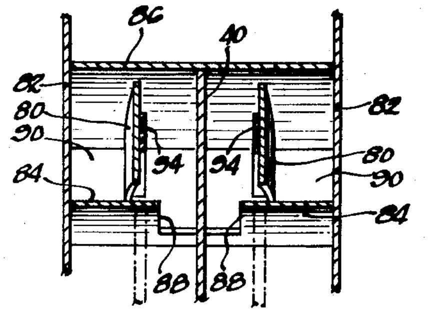
Fig. 3 is a fragmentary sectional view taken along a line 3—3 in Fig. 2.

While the housing 78 may assume a variety of forms, it is illustrated as an arcuate, generally tubular member of rectangular cross section. The conductive plate 40 forms one side wall of the housing 78. The opposite side wall is formed by a flat plate 82 (Fig. 3). Inner and outer curved walls 84 and 86 extend between the flat walls 40 and 82. It will be seen that a longitudinal slot 88 is formed in the curved inner wall 84 to admit the arm 22 and electrodes 24 and 26.

At one end of the resonator 32, adjacent the flat coil 30, the housing 78 has an opening 90 which provides an entrance for the electrodes 24 and 26. The other end of the housing 78 is closed by an end wall 92. It will be understood that all of the walls 40, 82, 84, 86 and 92 of the housing 78 are made of metal or other conductive material.

The construction of the center post 80 may be varied, but in this instance it is in the form of a conductive plate which is of generally flat arcuate form. In some cases the post 80 may be slightly curved rather than being strictly flat. It will be seen that the post 80 is mounted on the end wall 92 and electrically connected thereto. The post 80 extends in the housing 78 along the entire length thereof. Throughout its length, the post 80 is spaced from the walls of the housing 78. The outer end of the post 80 is floating or entirely free of any connection to the walls of the housing 78.

To guide the electrode 24 in its movement through the housing 78, an arcuate guide member 94 is mounted in the housing. Preferably, the guide member 94 is made of electrically insulating material and is mounted directly on the center post 80 so as to insulate the electrode 24 from the post. In this way, the electrode 24 will be capacitively coupled to the post. The insulating member 94 may have one end secured to the post 80 by means of a screw or fastener 96. A locating lug 98 may be formed on the other end of the insulating member 94 and may be arranged to extend through an aperture 100 in the post 80. In the illustrated construction, the outer end of the post 80 is supported by being received in a notch or recess 102 formed in the insulating plate 44 which supports the flat coil 30. The end of the post 80 is substantially flush with the surface of the plate 44 so that the electrode 24 will move smoothly between the flat coil 30 and the post.

Tuners constructed in accordance with the present invention may be employed in a variety of circuits. One such circuit is illustrated by way of example in Fig. 6. In this instance, the tuners 10 and 12 are arranged to provide coupling between a radio frequency amplifying stage 106 and a frequency conversion stage 108 of a superheterodyne receiver for television or other high radio frequency signals. Actually, the amplification stage 106 is arranged to function only for the V. H. F. television bands. For the U. H. F. band, the tuners 10 and 12 are operative to couple signals from an antenna or other source directly to the conversion stage 108.

In the illustrated construction, U. H. F. input terminals 110 and 112 are provided to receive U. H. F. signals from an antenna or the like. The U. H. F. signals are applied to the tuner 10 by means of twin coupling loops 114 and 116 which are disposed in the housing 78 for the cavity resonator 32 of the tuner 10. One end of each loop 114 and 116 is grounded to the housing 78. The other ends are connected to the U. H. F. input terminals 110 and 112. The arrangement of the loops 114 and 116 provides a U. H. F. input which is balanced with respect to ground.

The movement of the slider electrodes 24 along the center posts 80 of the resonators 32 is effective to vary the tuning of the tuners 10 and 12 so as to cover the U. H. F. television band, or any other predetermined range of frequencies in the ultra frequency spectrum. Sufficient coupling is provided between the resonators 32 of the tuners 10 and 12 by the end openings 90 and the slots 88. This coupling transfers the signals from the tuner 10 to the tuner 12. U. H. F. output from the tuner 12 is derived by means of a coupling loop 118 disposed in the cavity resonator 32 of the tuner 12. One side of the output loop 118 is grounded to the housing 78, while the other side is connected to an output lead 120 which carries the output signals to the frequency conversion stage 108.

While the amplification stage 106 and the conversion stage 108 may be arranged in various ways, it will be of interest to note that the illustrated amplification stage 106 comprises an amplifying device which in this instance is a triode type electron discharge tube 122 having a cathode 124, a grid 126 and a plate or anode 128. It will be seen that the V. H. F. input signals are applied across input terminals 130 and 132 which are connected between the cathode 124 and ground. The grid 126 is effectively grounded by means of a bypass capacitor 134 connected between the grid and ground. A grid return resistor 136 is connected between the grid 126 and the cathode 124, while another resistor 138 is connected between the grid and a lead 140 which may extend to a source of automatic gain control voltage.

Positive supply voltage is applied to the plate 128 through a radio frequency choke coil 142 and a filtering resistor 144 connected in series between the plate and a positively charged plate supply terminal 146. A bypass capacitor 148 is connected between ground and the junction of the choke 142 and the resistor 144.

For the V. H. F. television band, or for any other suitable frequency ranges, the input signals from the amplification stage 106 are applied to the terminals 56 and 62 on the flat coil 30 of the tuner 10. It will be seen that a coupling capacitator 150 is connected between the plate 108 and a lead 152. In this instance, supplementary inductance coils 154 and 156 are connected between the lead 152 and the respective terminals 56 and 62 of the tuner 10. The inductance of the coils 154 and 156 supplements that of the flat coil 30.

While there is inherent coupling between the flat coils 30 of the tuners 10 and 12, due to mutual inductance and capacitance, additional coupling is provided in this instance by means of capacitors 158 and 160. It will be seen that the capacitor 158 is connected directly between the terminals 62 of the tuners 10 and 12. The capacitor 160 is connected between the lead 152 and a lead 162. Supplementary inductances 164 and 166 extend between the lead 162 and the terminals 56 and 62 on the flat coil 30 of the tuner 12.

In the illustrated circuit, the conversion stage 108 utilizes a crystal or any other suitable rectifier 168 which is employed for both U. H. F. and V. H. F. signals. The V. H. F. signals are applied to the rectifier 168 by means of a coupling capacitor 170 which is connected between the lead 162 and a lead 172 extending to one side of the rectifier. The other side of the rectifier is connected to a lead 174 and thence through an impedance matching coil 176 to the ungrounded terminal lead 120 of the U. H. F. output coupling loop 118. A direct current return path for the rectifier 168 is provided by a radio frequency choke coil 178 which is connected between the lead 172 and a metering terminal 180. A jumper 182 normally extends between the terminal 180 and a second metering terminal 184 which is grounded. When it is desired to measure the direct current through the rectifier 168, a suitable meter may be connected across the terminals 180 and 184 in place of the jumper 182. A bypass capacitor 186 is connected between the metering terminal 180 and ground.

To lower the impedance of the rectifier circuit for U. H. F. signals, a small capacitor 188 is connected between the lead 172 and ground. This capacitor is of such a small value that it has not substantial effect for signals in the V. H. F. television bands. However, this capacitor has a sufficiently low impedance in the U. H. F. television band to cooperate with the coil 176 so as to match the impedance of the crystal rectifier 168 to that of the loop and thereby provide for efficient transfer of signals from the low impedance loop 118 to the series circuit including the coil 176, the rectifier 168 and the capacitor 188.

Intermediate frequency output signals are derived from the frequency conversion stage 108 through an output coupling capacitor 190 connected between the lead 172 and an output lead 192 which may extend to the intermediate frequency amplifier of the television receiver. Signals from the local heterodyne oscillator are applied to the conversion stage 108 by means of a lead 194 which extends from the oscillator and has an end portion 196 which is brought into a position adjacent the rectifier 168 so as to be capacitively coupled thereto.

It will be seen that each of the flat coils 30 of the tuners 10 and 12 has a low frequency portion 198 and a high frequency portion 200 connected to the terminals 56 and 62, respectively. The coil elements 52 and 54 constitute the low frequency portion 198, while the coil elements 58 and 60 constitute the high frequency portion 200.

In operation, the tuners 10 and 12 are tuned by rotating the shaft 18 so as to move the electrodes 24 along the flat coils 30 and then into the cavity resonators 32. In Fig. 2, electrodes 24 and 26 are shown in a position corresponding to a point adjacent the low frequency end of the tuning range. When the electrode 24 is moved over the stationary electrode 46, the extreme end of the low frequency coil 198 is effectively coupled to ground by virtue of the capacitance between the electrodes 24 and 46. It will be recalled that the electrode 24 is effectively grounded through the electrode 26 and the ground plate 38. Thus, one end of the low frequency coil 198 is effectively grounded while the other end is connected to the terminal 56 and thence through the supplementary inductance coil 154 and the capacitor 150 to the plate 128 of the amplifying tube 122. The tuner 10 thus provides a resonant output circuit for the tube 122. It will be understood that the inductances of the coils 154 and 198 are resonated by the output capacitance of the tube 122, in series with the capacitance of the capacitor 150 and the capacitance between the electrodes 24 and 46.

As the shaft 18 is rotated in a clockwise direction, as seen in Fig. 2, the electrode 24 moves over the successive stationary electrodes 46, 47 and 48 so as gradually to reduce the effective inductance of the low frequency coil 198. In other words, movement of the electrode 24 diminishes the portion of the coil 198 between the terminal 56 and ground. Moreover, the portion of the coil 198 covered by the movable electrode 24 is effectively short circuited and thereby rendered ineffective. In this way, the resonant frequency of the tuners 10 and 12 is increased. The short circuiting action also tends to eliminate spurious resonances and responses.

As the electrode 24 is moved over the stationary electrode 48 and toward the stationary electrode 49, the high frequency coil 200 is brought into the circuit. With the electrode 24 over the electrode 49, the extreme end of the coil 200 is effectively grounded, while the other end is connected to the terminal 62 and thence through the coil 156 and the capacitor 150, to the plate 128. For the high frequency portion of the V. H. F. band, the low frequency coil 198 is left floating and hence is effectively removed from the circuit. Movement of the electrode 24 along the stationary electrodes 49, 50 and 51 reduces the effective inductance of the high frequency coil 200 by diminishing the portion of the coil between the terminal 62 and ground. The portion of the coil 200 covered by the electrode 24 is effectively short circuited.

The U. H. F. band is covered by movement of the electrode 24 into and through the cavity resonator 32. As the electrode 24 enters the resonator housing 78, it moves over the free end of the center post 80 and onto the insulating guide 94. At this point, the cavity resonator 32 is tuned to its lowest operating frequency, by virtue of the capacitance between the electrode 24 and the center post 80. Again it will be recalled that the electrode 24 is effectively grounded through the electrode 26 and the ground plate 40.

As the electrode 24 is swung along the center post 80, the resonant frequency of the resonator 32 is increased. This increase is brought about by the decreasing inductance of the portion of the post 80 lying between the electrode 24 and the end wall 92 of the cavity resonator, and by the decreasing capacitance between the electrode 24 and the post. It will be recalled that the decreasing capacitance is due to the angularity of the post and the increasing thickness of the insulating guide 94. In other words, the decreasing capacitance is due to the divergence between the post and the path of the electrode 24. With the electrode 24 fully moved into the housing 78, the resonant frequency of the cavity resonator 32 is at its highest value.

The V. H. F. signals are coupled between the tuners 10 and 12 by the inherent mutual inductance and capacitance and the additional capacitance of the capacitors 158 and 160. The coupling may be adjusted to any desired value, such as one that will provide a band pass characteristic. For U. H. F. signals, the inherent coupling between the cavity resonators 32 is sufficient in this instance. This inherent coupling is due to the end openings 90 and the slots 88.

The V. H. F. signals are coupled to the conversion stage 108 by the capacitor 170. For the V. H. F. bands, the small impedances of the U. H. F. output loop 118 and the choke 176 are virtually negligible. Moreover, the capacitor 188 has such a high impedance that it has no substantial effect. Thus, intermediate frequency output signals are developed in the usual manner across the rectifier 168 and are transmitted to the intermediate frequency amplifier by the coupling capacitor 190.

In the U. H. F. band, the input signals are applied to the cavity resonator 32 of the tuner 10 by the coupling loops 114 and 116. The output signals are derived from the cavity resonator 32 of the tuner 12 by the output loop 118 and are transmitted to the circuit comprising the impedance matching coil, the rectifier 168 and the U. H. F. by-pass capacitor 188. Intermediate frequency signals are developed across the capacitor 188.

It will be recognized that the tuner is capable of covering an extremely wide frequency range because of the cooperative arrangement of the flat coils and the cavity resonators. High efficiency and selectivity is afforded throughout the tuning range, even in the U. H. F. band, due to the high Q of the cavity resonators. In the V. H. F. bands, the flat coil provides amply high Q.

The tuning unit has the advantage of being operable by a single shaft which is rotatable through a range of about one half revolution. Thus, the tuning unit is ideally suited for use in an all-band television receiver.

It will be recognized that the tuning unit is extremely compact and unusually low in cost. One factor contributing to the low cost is the fact that the flat coils may be produced by printed circuit techniques. The cavity resonators are also very simple to manufacture. In every way, the tuning unit is well adapted for use in commercial television receivers.

Various other modifications, alternative constructions and equivalents may be employed without departing from the true spirit and scope of the invention as exemplified in the foregoing description and defined in the following claims.

I claim:

1. In a wide range tuner for high radio frequencies, the combination comprising a rotatable shaft having an arm thereon, first and second oppositely facing slider electrodes mounted on said arm for movement along arcuate paths, conductive plate means engaging said first slider electrode and extending along the arcuate path thereof for establishing a circuit connection therewith, means conductively interconnecting said slider electrodes, a flat inductance coil engageable with said second slider electrode and extending along a first portion of the arcuate path thereof, said flat coil including a flat supporting plate made of electrically insulating material, a plurality of flat conductive convolutions mounted on said plate closely adjacent the path of said second electrode, and an insulating film covering said convolutions and interposed between said convolutions and said second electrode, an arcuate cavity resonator disposed around a second portion of the path of said second electrode, said resonator having outer wall elements around the path of said second electrode and substantially spaced therefrom, a portion of said conductive plate means constituting one of said wall elements, a flat arcuate conductive post disposed in said cavity resonator and extending adjacent said second portion of the path of said second electrode, said post having one end portion adjacent said flat coil and closely adjacent the path of said second electrode, said post diverging angularly from said path of said second electrode between said one end portion and the opposite end portion so that movement of said second electrode along the second portion of said path thereof will vary the tuning of said cavity resonator, and an insulating member of progressively increasing thickness mounted on said post for slidably guiding said second electrode for movement along said post in capacitive relation thereto.

2. In a wide range tuner for radio frequencies, the combination comprising a swingably mounted slider electrode mounted for movement along an arcuate path, means for establishing a circuit connection to said electrode, said path having first and second successive portions, a flat inductance coil extending along said first portion of said path for slidable engagement by said electrode, said coil having a plurality of flat conductive turns distributed along said first portion, said electrode in moving along said first portion being operative to vary the effective inductance of said coil, a cavity resonator having a conductive housing disposed around said second portion of said path, said electrode being movable into and along said resonator in traversing said second portion, and a conductive post mounted in said resonator along said second portion of said path but angularly related thereto, said post being spaced from said second portion of said path by an amount which varies progressively along said path so that the effective inductance of said post and the capacitance between said post and said electrode will be varied by movement of said electrode along said post.

3. In a tuner for high radio frequencies, the combination comprising a resonator housing having a plurality of conductive side wall elements defining a cavity with an end wall element extending across one end thereof and connected to said side wall elements, said housing having an opening in the end thereof opposite from said one end and a longitudinal slot formed in one of said side wall elements, an arcuate conductive post mounted on said end wall element and extending in said arcuate cavity in spaced relation to said side wall elements, a swingably mounted arm movable along said slot, an electrode mounted on said arm for movement therewith along an arcuate path adjacent said post and in capacitive relation thereto, and means for establishing a circuit connection to said electrode, said post being angularly related to the path of said electrode so as to diverge from said path between said opening and said end wall element, the spacing between said post and said path increasing progressively along said path between said opening and said end wall element whereby movement of said electrode will vary the tuning of said resonator.

4. In a tuner for high radio frequencies, the combination comprising a generally tubular arcuate resonator housing having a pair of spaced flat arcuate side walls with inner and outer curved arcuate wall elements extending therebetween, an end wall element fixed on said housing at one end thereof, said housing having an opening at the opposite end thereof and a longitudinal slot extending from said opening along said inner curved wall element, a rotatable shaft having an arm mounted thereon for swinging movement therewith along said slot, an electrode mounted on said arm for movement therewith along an arcuate path extending longitudinally within said housing, said housing having an arcuate conductive post mounted on said end wall element and extending adjacent said arcuate path in spaced relation thereto and in spaced relation to said side walls and curved wall elements, an insulating member mounted on said post and slidably engaging said electrode, said post being angularly related to said path and being arranged to diverge therefrom between said opening and said end wall element, said insulating member increasing progressively in thickness between said opening and said end wall element.

5. In a wide range tuner for high radio frequencies, the combination comprising a rotatable shaft having an arm thereon, a slider electrode mounted on said arm for movement along an arcuate path, means for establishing a circuit connection to said electrode, a flat inductance coil engageable with said slider electrode and extending along a first portion of the arcuate path thereof, said flat coil including a flat supporting plate made of electrically insulating material, and a plurality of flat conductive inductance elements mounted on said plate closely adjacent the path of said slider electrode, insulating means interposed between said coil and said electrode, an arcuate cavity resonator disposed along a second portion of the path of said electrode, said resonator having outer conductive wall elements around said path, said resonator having a longitudinal slot therein affording passage for said arm, a flat arcuate conductive post disposed in said cavity resonator and extending adjacent said second portion of said path, and means insulating said electrode from said post, said electrode being movable along said post to vary the tuning of said cavity resonator.

6. In a wide range tuner for high radio frequencies, the combination comprising a rotatable shaft having an arm thereon, a slider electrode mounted on said arm for movement along an arcuate path, means for establishing a circuit connection to said electrode, a flat inductance coil engageable with said slider electrode and extending along a first portion of the arcuate path thereof, said flat coil including a flat supporting plate made of electrically insulating material, and a plurality of flat conductive inductance elements mounted on said plate closely adjacent the path of said slider electrode, insulating means interposed between said coil and said electrode, an arcuate cavity resonator disposed along a second portion of the path of said electrode, said resonator having outer wall elements around said path, a flat arcuate conductive post disposed in said cavity resonator and extending adjacent said second portion of said path, and means insulating said electrode from said post, said post diverging from said second portion of said path of said electrode, the spacing between said post and said second portion of said path thereby increasing progressively therealong, said electrode being movable along said post to vary the tuning of said cavity resonator.

7. In a tuner for high radio frequencies, the combination comprising a generally tubular arcuate resonator housing having arcuate side walls with an end wall extending therebetween, said housing having an opening at the opposite end thereof and a longitudinal slot extending from said opening along one of said side walls, a rotatable shaft having an arm mounted thereon for swinging movement therewith along said slot, an electrode mounted on said arm for movement therewith along an arcuate path extending longitudinally within said housing, said housing having an arcuate conductive post mounted on said end wall and extending adjacent said arcuate path in spaced relation thereto and in spaced relation to said side walls, an insulating member interposed between said post and said electrode, said post being angularly related to said path and being arranged to diverge therefrom between said opening and said end wall element, the spacing between said post and said path thereby increasing progressively therealong, said insulating member increasing progressively in thickness between said opening and said end wall element.

References Cited in the file of this patent

UNITED STATES PATENTS

| | | |
|---|---|---|
| 2,513,392 | Aust | July 4, 1950 |
| 2,638,544 | Schreiner | May 12, 1953 |
| 2,729,747 | Rieth | Jan. 3, 1956 |
| 2,734,175 | Wasmandorff | Feb. 7, 1956 |
| 2,748,286 | Bussard | May 29, 1956 |

OTHER REFERENCES

Radio Electronic Engineering, April 1953, pp. 15–16 and p. 30. Copy in 250–40Z.

Electronics, March 1953, pp. 106–111. Copy in 250–20.37.

Television Retailing, August 1952, p. 76. Copy in 250–20.37.